United States Patent
Gibbons (12)

(10) Patent No.: US 6,845,139 B2
(45) Date of Patent: Jan. 18, 2005

(54) CO-PRIME DIVISION PRESCALER AND FREQUENCY SYNTHESIZER

(75) Inventor: Scott G. Gibbons, San Jose, CA (US)

(73) Assignee: DSP Group, Inc., Santa Clara, CA (US)

(*) Notice: Subject to any disclaimer, the term of this patent is extended or adjusted under 35 U.S.C. 154(b) by 196 days.

(21) Appl. No.: 10/227,140

(22) Filed: Aug. 23, 2002

(65) Prior Publication Data

US 2004/0036513 A1 Feb. 26, 2004

(51) Int. Cl.[7] .............................................. H03K 21/00
(52) U.S. Cl. ......................................... 377/47; 377/48
(58) Field of Search ..................................... 377/47, 48

(56) References Cited

U.S. PATENT DOCUMENTS 6,614,870 B1 * 9/2003 Miller ......................... 377/48

2002/0006179 A1   1/2002 Verlinden ..................... 377/47
2002/0033738 A1   3/2002 Sacki et al. .................. 331/17

* cited by examiner

Primary Examiner—Margaret R. Wambach
(74) Attorney, Agent, or Firm—Meyertons Hood Kivlin Kowert & Goetzel, P.C.

(57) ABSTRACT

A system may include a control unit and a dual modulus prescaler. The control unit may generate a modulus control signal. The dual modulus prescaler may be configured to divide the frequency of an input signal by Q when the modulus control signal has a first value and to divide the frequency of the input signal by (Q+V) when the modulus control signal has a second value. Q is an irreducible fraction. The sum (Q+V) may be an integer or a fraction. The dual-modulus prescaler includes several clocked storage units (e.g., flip-flops) that are each clocked by a respective one of several equally spaced phases of the input signal. Each clocked storage unit operates in a toggle mode.

26 Claims, 14 Drawing Sheets

CO-PRIME DIVISION PRESCALER AND FREQUENCY SYNTHESIZER

BACKGROUND OF THE INVENTION

1. Field of the Invention

This invention relates to frequency dividers and dual-modulus prescalers.

2. Description of the Related Art

Indirect phase-locked frequency synthesizers, commonly known as phase-locked loops (PLLs), are often used to generate a signal at a desired frequency. A block diagram of a typical PLL 10 is shown in FIG. 1. The illustrated PLL 10 includes a voltage-controlled oscillator (VCO) 18, a feedback division network 20, a reference divider 12, a phase detector 14, and a loop filter 16.

The output signal 19 of the VCO 18 is divided within the feedback division network 20. The reference signal 11, typically generated by a crystal oscillator, is divided within the reference divider 12. The output 21 of the feedback division network 20 and the output 13 of the reference divider 12 are then compared within the phase detector 14. Any phase difference between the two signals results in the phase detector 14 generating a corresponding error correction signal 15. This error correction signal 15 is filtered by the loop filter 16 and applied to the VCO 18, causing the output signal 19 of the VCO 18 to change so that the phase difference between the divided reference signal 13 and divided output signal 21 will be reduced.

A common method of changing the frequency of the VCO 18 involves controlling the feedback division value N. Typically, the reference division value, R, is a constant and thus the phase detection frequency, $F_{CR}$, is also a constant. The amount of time between when N is changed and when the VCO's frequency has settled to within some specified error of the desired frequency (commonly called settling time) is inversely proportional to $F_{CR}$ because an inversely proportional relationship exists between settling time and the closed loop bandwidth of the PLL 10. In order to maintain a stable loop, the closed loop bandwidth must be restricted to be a small percentage of $F_{CR}$, typically 10% or less. Additionally, the phase noise level of the PLL 10 inside its closed loop bandwidth is inversely proportional to $F_{CR}$, because the phase noise level of the PLL inside its closed loop bandwidth is directly proportional to the magnitude of N, and an inversely proportional relationship exists between the magnitudes of N and $F_{CR}$. Conversely, the frequency resolution of the PLL is directly proportional to $F_{CR}$ because the frequency resolution of the PLL is equal to the product of $F_{CR}$ and the resolution in changing the value of N.

Two common implementations of a variable feedback division network 20 have evolved in attempts to provide fast settling time, fine frequency resolution, and low integrated phase noise. A block diagram of one implementation, included in an integer-N PLL 10, is shown in FIG. 2. The feedback division network 20 of an integer-N PLL typically includes a dual-modulus (P/{P+U}) prescaler 26 followed by a main (M) counter 22 and an auxiliary (A) counter 24. The M counter 22 and the A counter 24 are typically implemented as integer down-counters. The output 25 of the dual-modulus prescaler 26 is applied as a clock signal to both the M and A counters, and thus both devices count downwards simultaneously from their programmed initial count values.

The programming of the M and A counters is such that the value of M is always greater than the value of A, ensuring that the A counter 24 reaches its terminal count of zero before the M counter 22 reaches its terminal count of zero. When the A counter 24 reaches its terminal count of zero, its modulus control output 23 (MC) toggles state. Once MC toggles, the A counter 24 ceases to count further until the M counter 22 reaches its terminal count of zero. However, the M counter 22 (which at that point in time contains a count value of {M–A}) continues counting downwards until it reaches its terminal count of zero. At this time, the M counter 22 outputs a pulse to the phase detector 14, and both the M and A counters re-load their programmed initial count values and the process starts over again.

The dual-modulus prescaler 26 is initially configured such that it divides by the alternate {P+U} integer modulus. The toggled state of MC causes the dual-modulus prescaler 26 to divide by the primary (P) integer modulus.

This integer-N implementation yields an integer value for the feedback division value N and provides integer resolution when changing the value of N. Because the resolution in changing the value of the feedback division is just U, the difference in value between the prescaler's moduli, U is typically set to one (1). In order to change the VCO's frequency by small steps, the integer-N implementation is forced to make the phase detection frequency, $F_{CR}$, equal to the step size divided by U, the resolution in changing the value of N. For closely spaced channels (small frequency steps), this leads to a large integer feedback division value, N, which increases the phase noise level inside the closed loop bandwidth, and slows settling time due to the narrow closed loop bandwidth limitation imposed by the small phase detection frequency. Due to these performance limitations, the integer-N implementation often results in a sub-optimal PLL.

The integer-N implementation is described by the following equations where A, M, R, P, & U are all integers:

$$F_{CR}=F_{REF} \div R \quad (1)$$

$$F_{CV}=F_{OUT} \div N_{INT}=F_{CR} \quad (2)$$

$$N_{INT}=A*(P+U)+(M-A)*P=M*P+A*U \quad (3)$$

$$F_{OUT}=N_{INT}*F_{CR}=(M*P+A*U)*F_{CR}=[(M*P+A*U)\div R]*F_{REF} \quad (4)$$

FIG. 3 shows a block diagram of a second implementation of a feedback division network 20 with variable division, which is included in a typical fractional-N PLL. Feedback division networks in fractional-N PLLs typically include a divider 28 that is modulated between two different integer division values such that the time averaged division value becomes a fractional value determined by the duty cycle at each integer divisor.

The arithmetic unit 30 that controls the divider modulus is typically an accumulator-based circuit that dynamically switches its modulus control output 23 in such a way as to cause the feedback division value, N, to be a time-averaged division value that is a fractional number between the integers D and {D+E}. This time-averaging is completed across F cycles of the phase detection frequency, $F_{CR}$, such that in K out of the F cycles, the integer divider modulus {D+E} is used, while in the remaining {F–K} cycles, the integer divider modulus D is used.

This fractional-N implementation yields a fractional value for the feedback division value N on a time-averaged basis, but the instantaneous feedback division value during any given cycle of the phase detection frequency is still an integer value (either D or {D+E}). The fractional-N implementation also yields a fractional resolution in changing the value of N as determined by the integers E, F, and K. The fractional-N implementation is described by the following equations where D, E, F, K, & R are all integers:

$$F_{CR} = F_{REF} \div R \quad (5)$$

$$F_{CV} = F_{OUT} \div N_{FRAC} = F_{CR} \quad (6)$$

$$N_{FRAC} = [K*(D+E)+(F-K)*D] \div F = D+(E*K \div F) \quad (7)$$

$$F_{OUT} = N_{FRAC} * F_{CR} = [D+(E*K \div F)]*F_{CR} = \{[D+(E*K \div F)] \div R\} *F_{REF} \quad (8)$$

In the locked condition, during {F−1} out of the F cycles of the phase detection frequency, the phase detector 14 detects a systematic phase error caused by the action of the arithmetic unit 30 and produces corresponding error correction signals 15. These systematic corrections give rise to spurious signals in the VCO's output unless the frequency content of the error correction signal 15 is adequately filtered by the loop filter 16.

The fractional-N implementation allows the phase detection frequency, $F_{CR}$, to be increased without a loss of frequency resolution because of the increased resolution in controlling the feedback division value N. The increase in $F_{CR}$ allows faster settling times due to the allowable increase in closed loop bandwidths. However, increased closed loop bandwidths provide less filtering of the spurious frequency content on the error correction signal 15. The increase in $F_{CR}$ also allows lower phase noise levels inside the closed loop bandwidth due to the reduction in the magnitude of N. These benefits come at the expense of the presence of spurious signals in the VCO output 19 or the expense of additional special circuitry within the arithmetic unit 30 used to alter the modulus control signal 23 in such a way that the resultant error correction signals 15 could be adequately filtered by the loop filter 16. Due to these performance and hardware limitations, the fractional-N implementation often results in a sub-optimal PLL.

SUMMARY

Various embodiments of a system and method employing co-prime frequency division may be implemented. In one embodiment, a system may include a control unit and a dual modulus prescaler. The control unit may generate a modulus control signal. The dual modulus prescaler may be configured to divide the frequency of an input signal by Q when the modulus control signal has a first value and to divide the frequency of the input signal by (Q+V) when the modulus control signal has a second value. Q is an irreducible fraction. The sum (Q+V) may be an integer or a fraction. The dual-modulus prescaler may include several clocked storage units (e.g., flip-flops) that are each clocked by a respective one of several equally spaced phases of the input signal. Each clocked storage unit may operate in a toggle mode. Such clocked storage units may be included in a co-prime frequency divider configured to generate T cycles of an output signal for every S cycles of the input signal. S and T are co-prime, and Q equals S/T. In many embodiments, S>T.

One embodiment of a prescaler (e.g., for use in a PLL) may include a clock generator and several flip-flops or other clocked storage units. The clock generator may be configured to generate a plurality of equally spaced phases of an input signal. Each flip-flop (or other type of clocked storage unit) may be clocked by a respective one of the equally spaced phases of the input signal. The flip-flops may be configured to operate in toggle mode. Additionally, each of the flip-flops may be configured to operate in a reset mode (e.g., maintaining an uninterrupted logic low state) while any other flip-flop is in a logic high state. In some embodiments, multiple stages of toggle-mode flip-flops (or other clocked storage units) may be chained together so that the outputs of one stage are used as the clock inputs of the next stage. The prescaler may include an output unit (e.g., an OR gate) that generates an output signal having a high logical level if any of the flip-flops in the final stage of flip-flops are in a logic high state. The output signal may have a low logical level if none of the flip-flops in the final stage of flip-flops are in a logic high state. In some embodiments, such a prescaler may be configured as a dual-modulus prescaler in which at least one of the moduli is an irreducible fraction.

Another embodiment of a method may involve: generating N equally spaced phases of an input signal; clocking each of several clocked storage units (e.g., flip-flops) with a respective one of the N equally spaced phases of the input signal; operating each of the clocked storage units in a toggle mode; and, if any one of the clocked storage units is in a logic high state, holding each other one of the clocked storage units in a reset mode.

BRIEF DESCRIPTION OF THE DRAWINGS

A better understanding of the present invention can be obtained when the following detailed description is considered in conjunction with the following drawings, in which.

Figure 1:
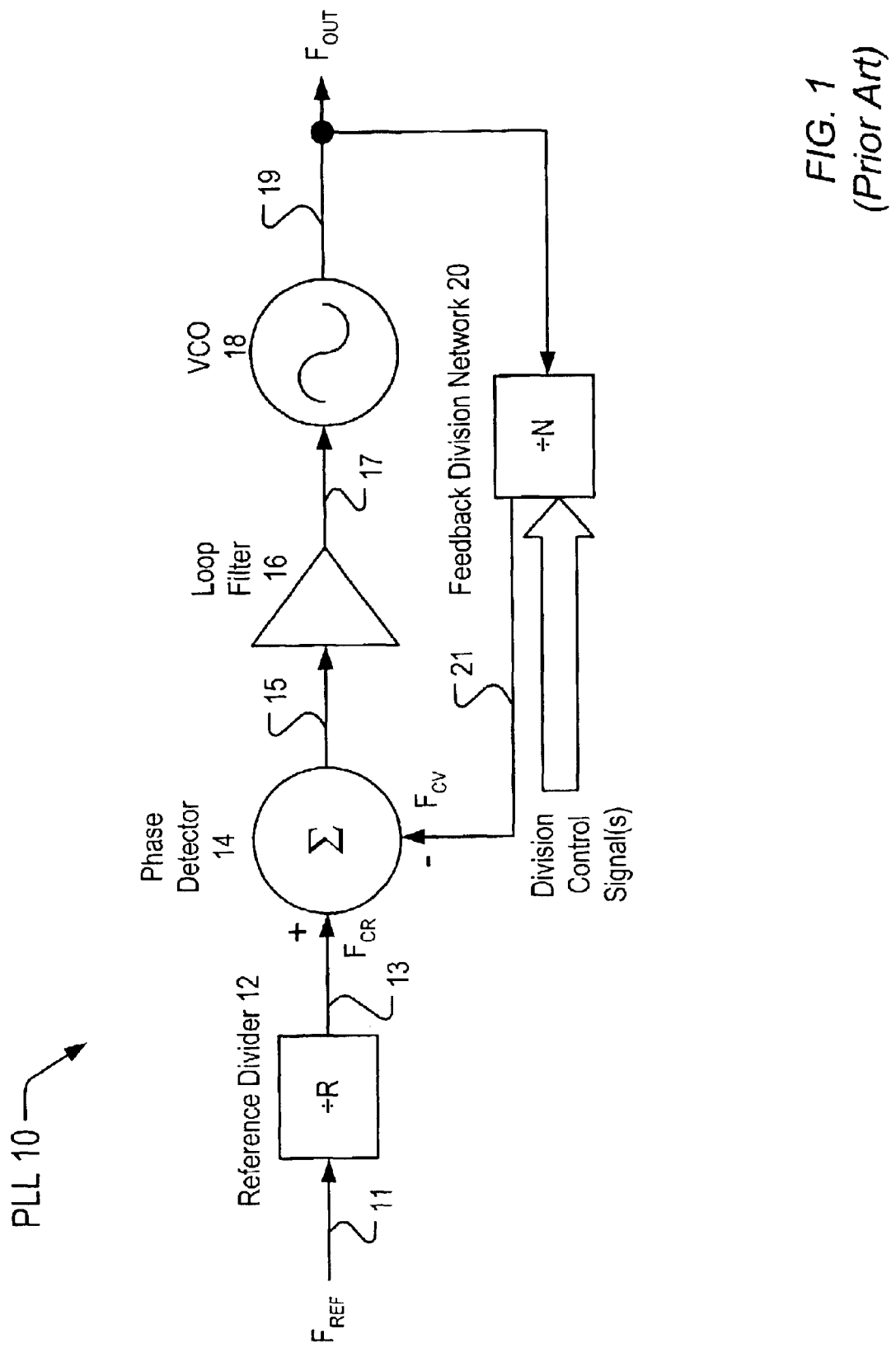
FIG. 1 illustrates a block diagram of a typical phase locked loop (PLL).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Various embodiments of systems and methods for performing co-prime frequency division may be implemented within frequency dividers by using T uniformly spaced phases of a clock signal to generate T cycles at the divider output during S cycles at the divider input, where S and T are co-prime and S>T.

Two integers S and T are co-prime if and only if the greatest common divisor between them is one (1). Since there are no common factors between S and T, dividing S by T results in a rational number in the form of an irreducible fraction (i.e., a fraction in its lowest terms). Note that integer division is a special case of co-prime division with T=1. Other than the degenerate case where T=1, all other choices of T will result in the irreducible fraction S/T being expressable in decimal form with a non-zero fractional component. For example, the simplest, non-degenerate co-prime frequency divider is a {3/2} divider (S=3 & T=2) that uses 2 uniformly spaced clock signal phases to output 2 cycles for every 3 cycles at its input and yields an instantaneous decimal division value of 1.5.

Figure 4:
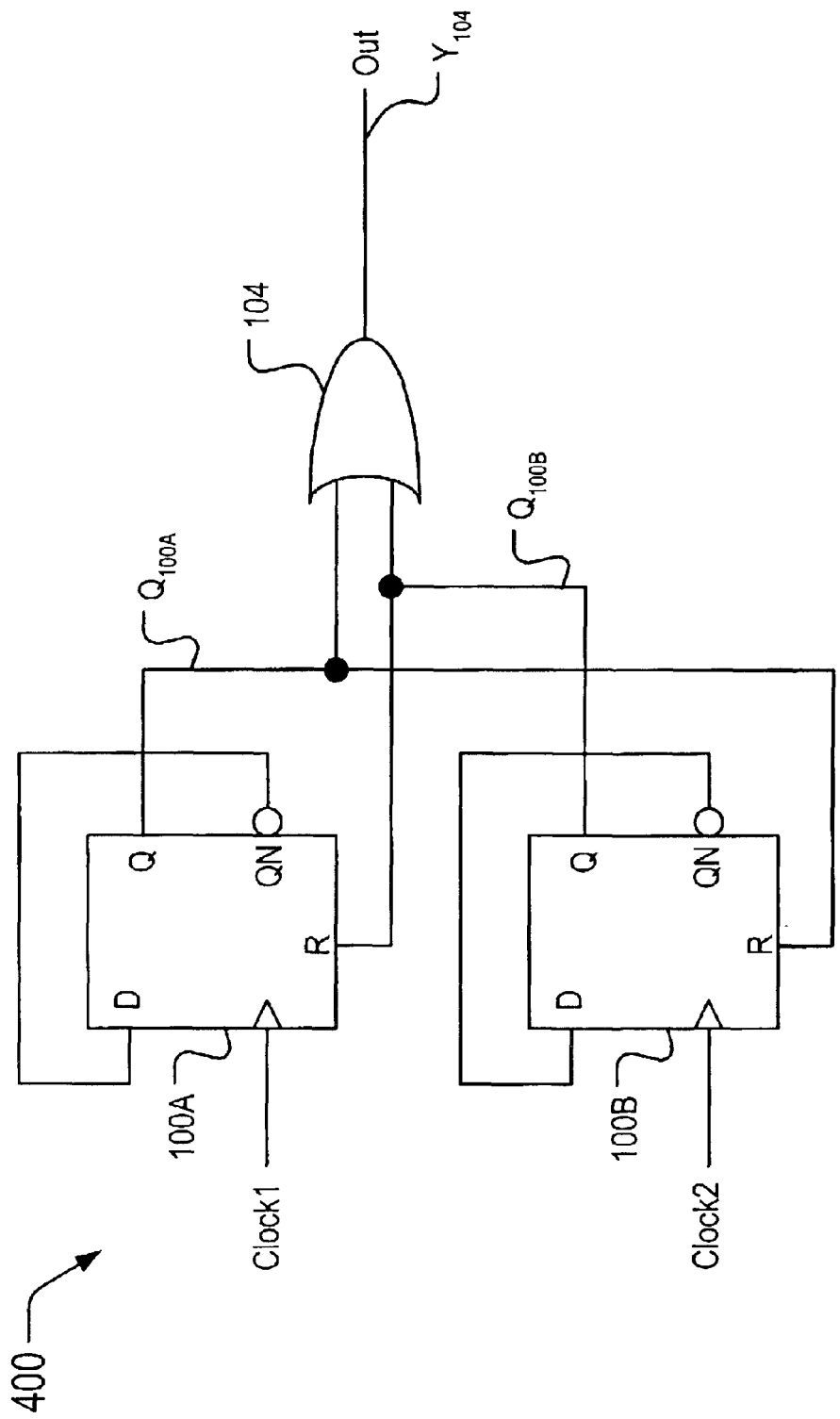
FIG. 4 is a block diagram of one embodiment of a co-prime frequency divider.

FIG. 4 shows one embodiment of a 3/2 co-prime frequency divider 400. Please note that for clarity, all propagation delays in this disclosure are shown as being zero. Note also that portions of a drawing labeled with the same numerical identifier (e.g., flip-flops 100A and 100B) may be collectively referred to by the numerical identifier alone (e.g., flip-flops 100).

In the embodiment of FIG. 4, S=3 and T=2 (for division by 3/2). Since T=2, two uniformly spaced phases of a clock signal are provided at the frequency divider input. Since one period of the clock is equivalent to 360° of phase, two clocks offset by {360°/2}=180° are used as inputs. If the duty cycle of the clock is 50%, one clock (e.g., Clock1) may be inverted in order to generate the second clock (e.g., Clock2). In other embodiments, such as those where the duty cycle of the clock is not 50%, an alternative means of achieving the phase offset, such as passing the clock signal through a phase shift network, may be used.

The two phase-offset clock signals, Clock1 and Clock2, each drive the clock input of a resettable flip-flop 100. Flip-flops 100 are each configured into a toggle mode by the connection of the inverted output (QN) output back to the input (D). While flip-flops 100 are D flip-flops in the illustrated embodiment, other embodiments may include other types of flip-flops that can be configured in a toggle mode and held in reset.

As shown in FIG. 4, the flip-flops 100 are cross-coupled so that each flip-flop is held in reset when the output of the other flip-flop is logical high (e.g., a logical '1' in active high logic or a logical '0' in active low logic). Thus, the output of flip-flop 100A ($Q_{100A}$) is connected to the reset input of flip-flop 100B, such that when $Q_{100A}$ is logic high, flip-flop 100B is held in reset (i.e., flip-flop 100B's output is maintained in a logic low state, despite the current value of flip-flop 100B's input). Likewise, the output of flip-flop 100B ($Q_{100B}$) is connected to the reset input of flip-flop 100A, such that when $Q_{100B}$ is at a logic high, flip-flop 100A is held in reset.

The outputs $Q_{100A}$ and $Q_{100B}$ are combined into signal $Y_{104}$ by logic block 104 such that $Y_{104}$ is logical high whenever either $Q_{100A}$ or $Q_{100B}$ are logical high and such that $Y_{104}$ is logical low if neither $Q_{100A}$ nor $Q_{100B}$ are logical high. Logic block 104 is shown as an OR function in FIG. 4. Note that several other logic functions such as NOR, XOR, and XNOR may alternatively be used to suitably combine $Q_{100A}$ and $Q_{100B}$ into signal $Y_{104}$ or its inverse, as desired.

Figure 5:
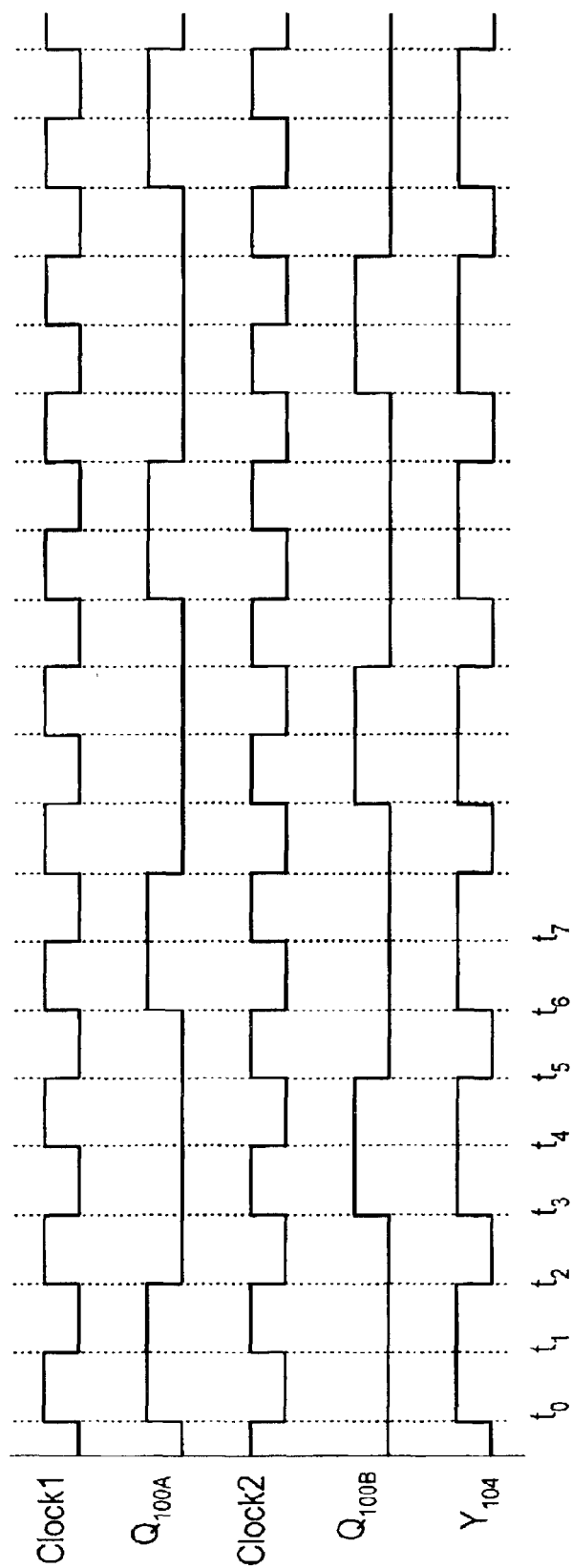
FIG. 5 illustrates exemplary waveforms that may be generated by one embodiment of a co-prime frequency divider.

FIG. 5 shows idealized waveforms that may be generated by the embodiment of the co-prime frequency divider shown in FIG. 4. If the flip-flops 100 are both assumed to be in their logic low states prior to time $t_0$, then the rising edge of Clock1 at time $t_0$ causes flip-flop 100A to transition into its logic high state. The rising edge of Clock2 at time $t_1$ would normally cause flip-flop 100B to transition into its logic high state, but instead flip-flop 100B is held in reset by the high logic level of $Q_{100A}$.

At time $t_2$, the rising edge of Clock1 toggles flip-flop 100A back into its logic low state, and thus at time $t_2$ flip-flop 100B is no longer being held in reset. The next rising clock edge of Clock2 occurs at time $t_3$, which causes flip-flop 100B to transition into its logic high state. Since flip-flop 100A is held in reset by the high logic level of $Q_{100B}$, flip-flop 100A does not transition into its logic high state in response to the rising edge of Clock1 at time $t_4$. At time $t_5$, the rising edge of Clock2 toggles flip-flop 100B back into its logic low state. This process then repeats itself such that the outputs generated at time $t_6$ are similar to those generated at time $t_0$.

The cross connection between flip-flops 100A and 100B creates a self-synchronized alternating division pattern, resulting in the signals $Q_{100A}$ and $Q_{100B}$, as shown in the waveforms of FIG. 5. Signals $Q_{100A}$ and $Q_{100B}$ are combined into signal $Y_{104}$ such that one period of $Y_{104}$ occurs for every 1.5 periods of Clock1. Thus, the frequency of $Y_{104}$ is equal to the frequency of Clock1 divided by 3/2. Accordingly, co-prime number division within a frequency divider may yield instantaneous fractional division values.

Using co-prime frequency division within a PLL may, in some embodiments, provide instantaneous fractional feedback division values (as opposed to the instantaneous integer feedback division offered by time-averaged fractional dividers) and allow fractional resolution in changing the feedback division value. This may in turn allow an increase in the phase detection frequency, $F_{CR}$, and the corresponding improvements in settling time and phase noise levels without the creation of spurious signal problems (e.g., in a VCO output in a PLL).

If the first divider stage within a dual-modulus prescaler uses co-prime frequency division, then the resolution in changing the value of the moduli may become fractional. Additionally, instantaneous fractional division values may be achieved for that stage. This fractional resolution is available because the use of T uniformly spaced phases of a clock signal when performing the co-prime division sets the interval between available clock transitions at 1/T (the reciprocal of the number of clock phases). For example, if a co-prime frequency divider of 9/2 is used as the first divider stage within a dual-modulus prescaler, then the available fractional resolution is 1/T=1/2 or 0.5.

Figure 2:
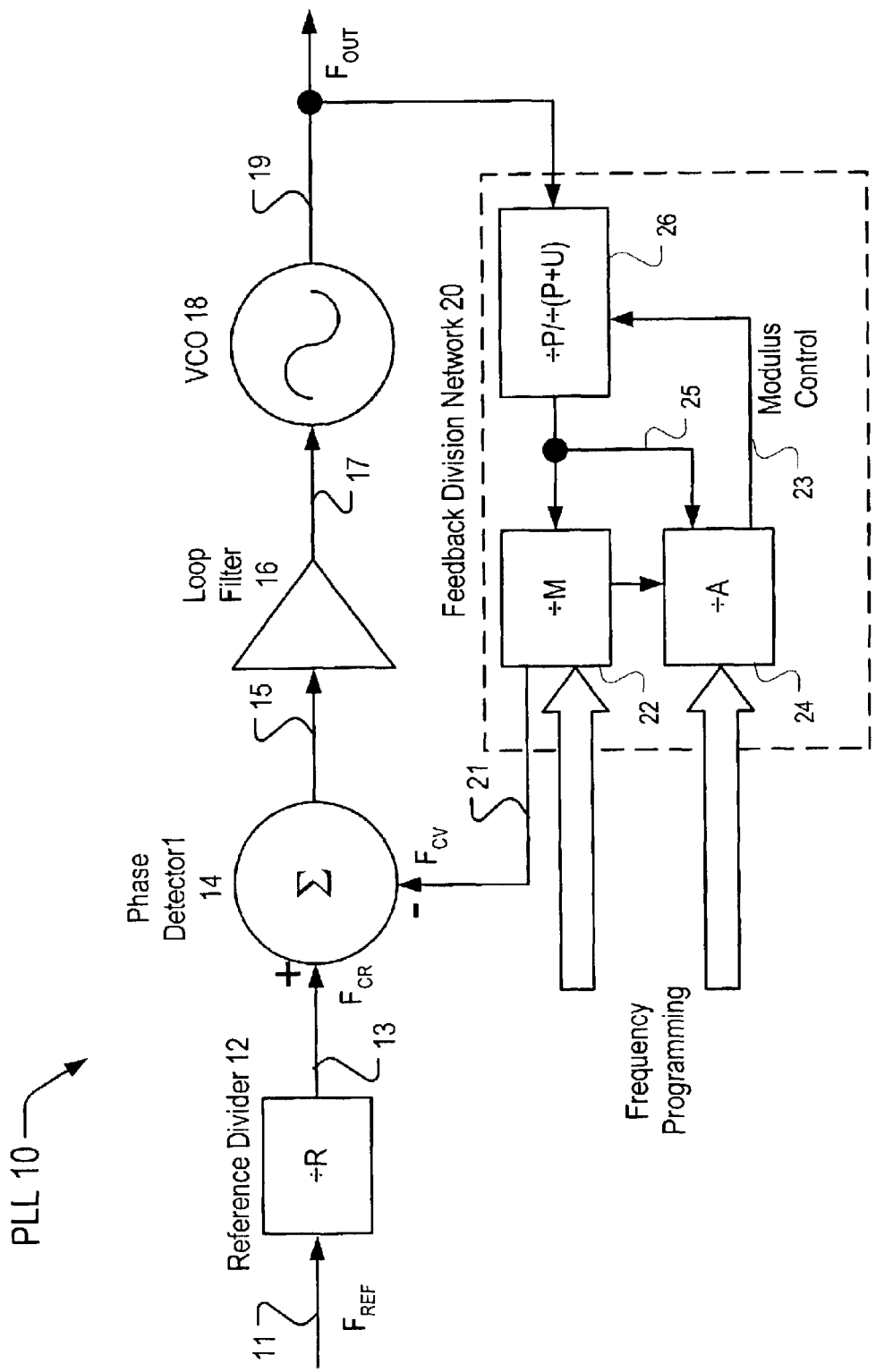
FIG. 2 is a block diagram of a typical integer-N PLL.
Figure 3:
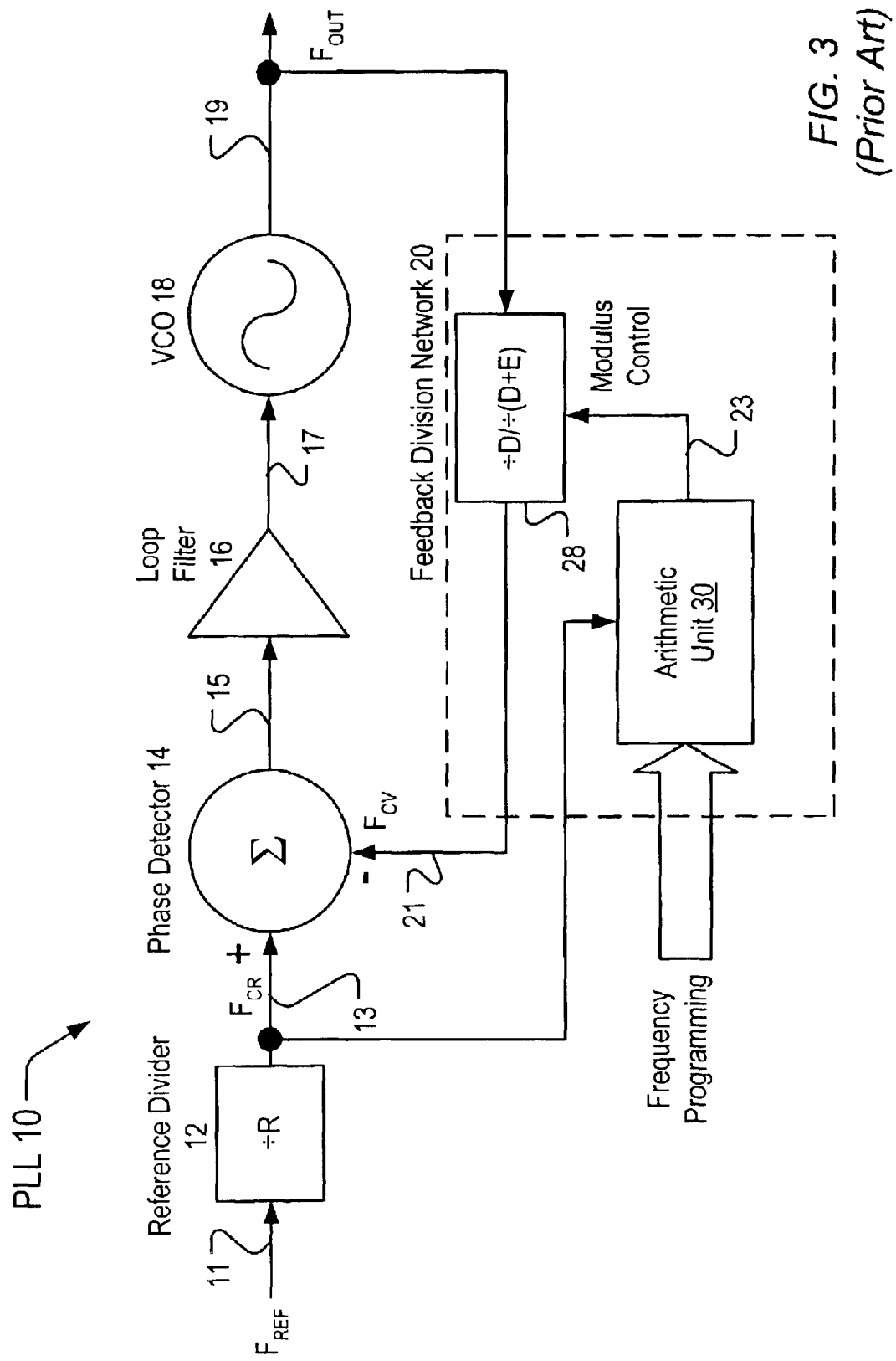
FIG. 3 shows a block diagram of a typical fractional-N PLL.
Figure 6:
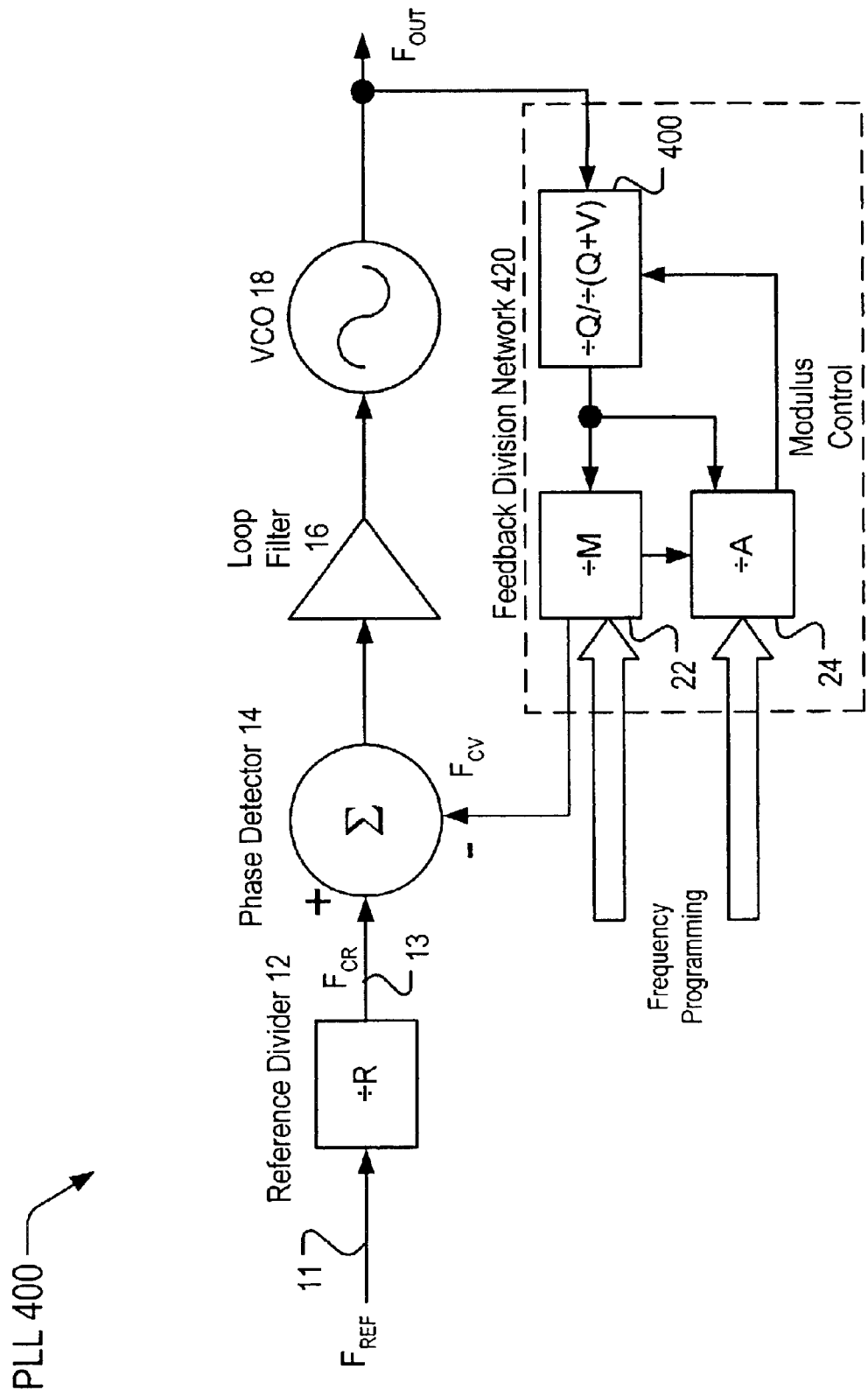
FIG. 6 shows a block diagram of one embodiment of a PLL that includes a co-prime frequency divider, or co-prime division PLL.

By using co-prime dividers, a co-prime division dual-modulus prescaler may be implemented whose primary modulus is an irreducible fraction and whose alternate modulus is separated from the primary modulus by either a fractional or integer value. Utilizing such a prescaler, along with the integer down-counters from a conventional integer-N PLL, instantaneous fractional feedback division values and fractional resolution in changing the feedback division values may be achieved with little (if any) spurious signal content and with little additional circuitry. FIG. 6 shows one such embodiment of a co-prime division PLL. Note that while the co-prime division PLL shown in FIG. 6 has many similarities to the integer-N implementation shown in FIG. 2, such as the integer main (M) counter 22 and integer auxiliary (A) counter 24, the prescaler 400 used in FIG. 6 is a Q/(Q+V) co-prime division dual-modulus prescaler, where Q is an irreducible fraction and V is either a fraction or an integer.

The co-prime division implementation of a PLL is described by the following equations where A, M, & R are all integers, Q is an irreducible fraction, and V is either a fraction or an integer:

$$F_{CR}=F_{REF} \div R \quad (9)$$

$$F_{CV}=F_{OUT} \div N_{COD}=F_{CR} \quad (10)$$

$$N_{COD}=A*(Q+V)+(M-A)*Q=M*Q+A*V \quad (11)$$

$$F_{OUT}=N_{COD}*F_{CR}=(M*Q+A*V)*F_{CR}=[(M*Q+A*V)+R]*F_{REF} \quad (12)$$

Figure 7:
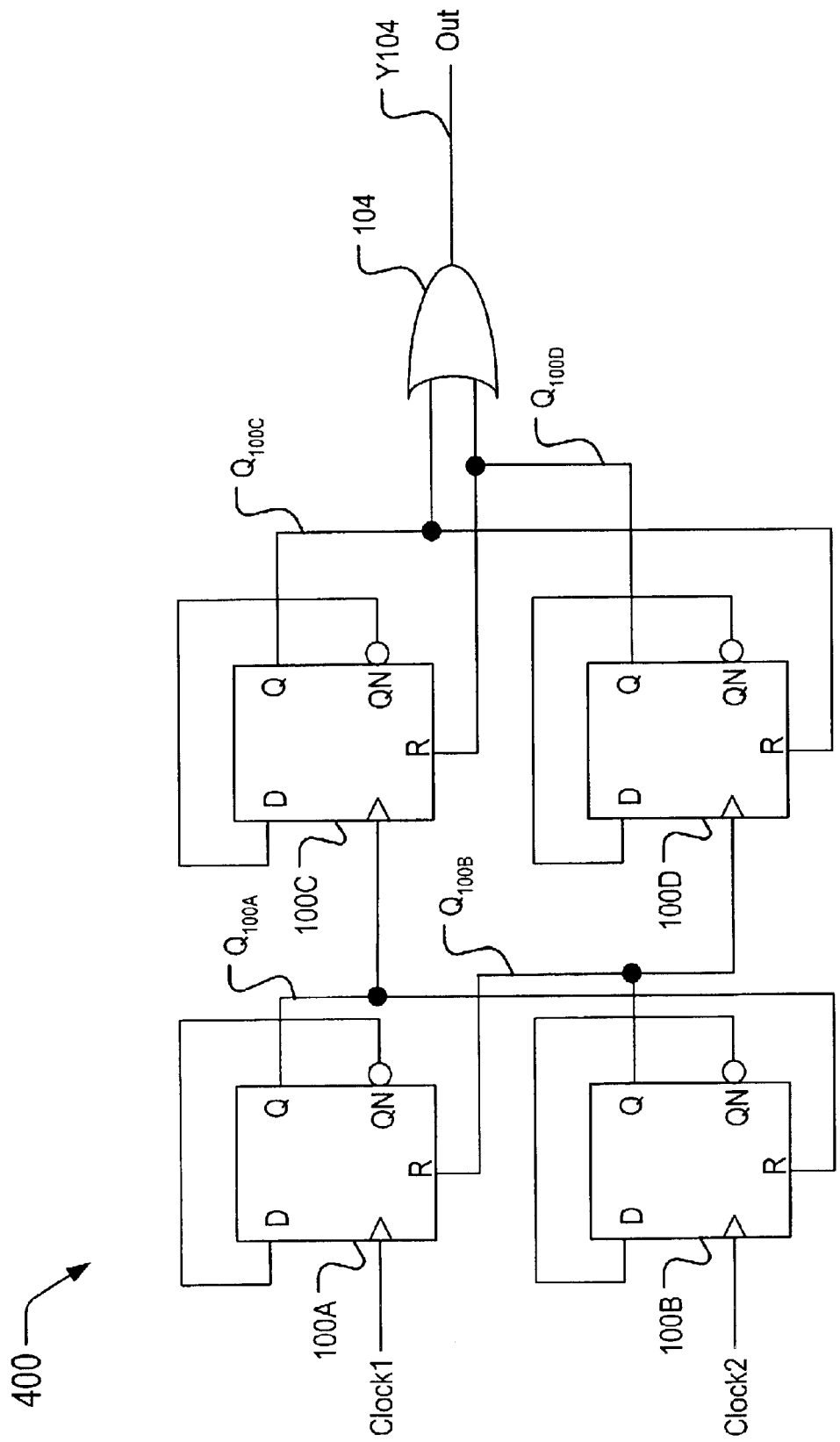
FIG. 7 is a block diagram of another embodiment of a co-prime frequency divider.
Figure 8:
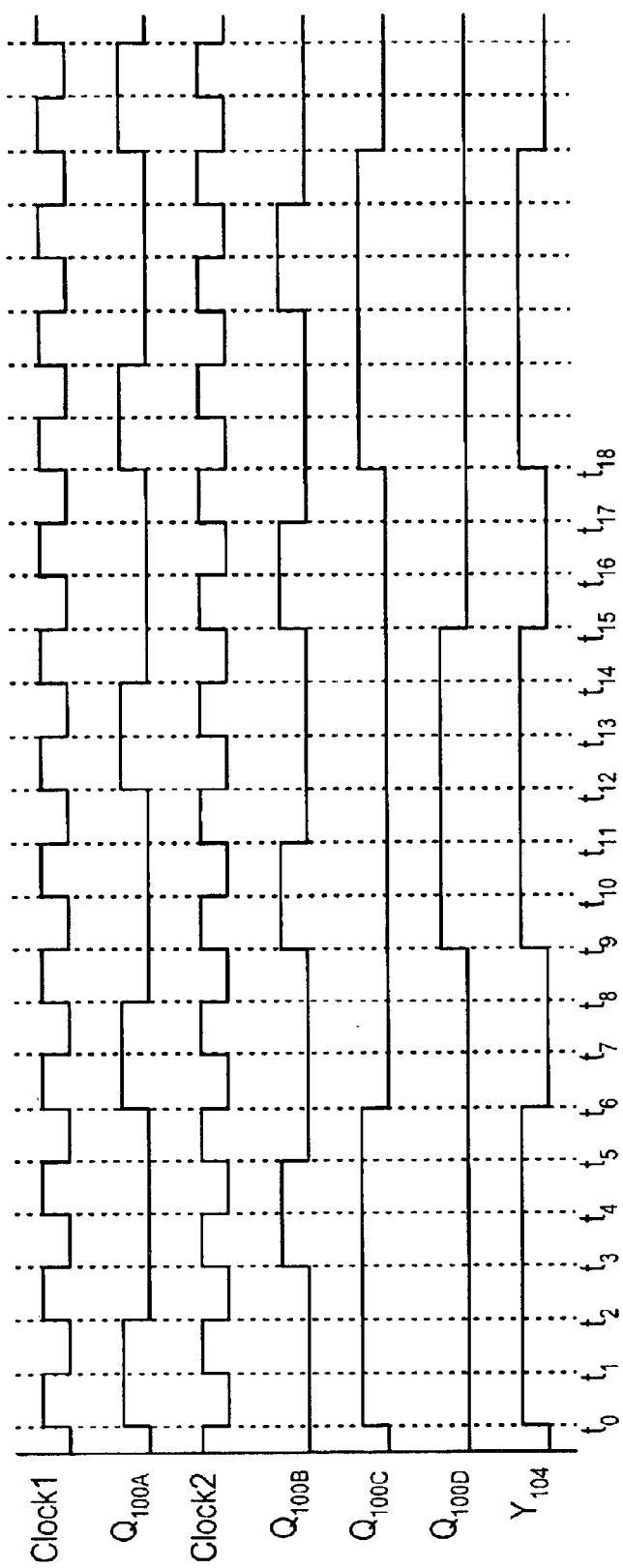
FIG. 8 illustrates exemplary waveforms that may be generated by an embodiment of a co-prime frequency divider.

FIG. 7 shows another embodiment of a single-modulus co-prime divider 400. This exemplary divider will then be augmented to extend it into a dual-modulus prescaler with fractional resolution between its moduli, as shown in FIG. 8. These examples show a single-modulus co-prime divider of 9/2 that has a fractional resolution of 0.5 when it is extended into a dual-modulus prescaler.

The two phase-offset clock signals used for {9/2} co-prime division are labeled Clock1 and Clock2 in FIG. 7. Each clock signal drives the clock input of a resettable D-type flip-flop (100A and 100B) configured into a toggle mode by the connection of its QN output back to its D input. Flip-flops 100A and 100B are cross-coupled so that each flip-flop's output is connected to the reset input of the other flip-flop. For example, the output $Q_{100A}$ of flip-flop 100A is connected to the reset input of flip-flop 100B such that when $Q_{100A}$ is at a logic high, it holds flip-flop 100B in reset (e.g., at its logic low state). The output $Q_{100B}$ of flip-flop 100B is similarly connected to the reset input of flip-flop 100A, such that when $Q_{100B}$ is at a logic high, it holds flip-flop 100A in reset. A second pair of similarly connected resettable D-type flip-flops 100C & 100D are coupled so that outputs $Q_{100A}$ and $Q_{100B}$ of the first pair of flip-flops are provided as the clock signals to the second pair. The outputs $Q_{100C}$ and $Q_{100D}$ of the second pair of flip-flops are combined into signal $Y_{104}$ in logic block 104.

Referring to the idealized waveforms of FIG. 8, if the flip-flops 100 are assumed to be in their logic low states prior to time t0, then the rising edge of Clock1 at time $t_0$ causes flip-flop 100A to transition into its logic high state. In turn, the rising edge of $Q_{100A}$ causes flip-flop 100C to transition into its logic high state. The rising edge of Clock2 at time $t_1$ would normally cause flip-flop 100B to transition into its logic high state, but instead flip-flop 100B is held in reset by the high logic level of $Q_{100A}$. At time $t_2$, the rising edge of Clock1 toggles flip-flop 100A back into its logic low state.

The next rising clock edge of Clock2 occurs at time $t_3$, which causes the output of flip-flop 100B to transition into its logic high state. The rising edge of $Q_{100B}$ would normally cause flip-flop 100D to transition into its logic high state, but instead flip-flop 100D is held in reset by the high logic level of $Q_{100C}$. Similarly, the rising edge of Clock1 at time $t_4$ would normally cause flip-flop 100A to transition into its logic high state, but instead flip-flop 100A is held in reset by the high logic level of $Q_{100B}$.

At time $t_5$, the rising edge of Clock2 toggles flip-flop 100B back into its logic low state. The next rising clock edge of Clock1 occurs at time $t_6$, which causes flip-flop 100A to transition into its logic high state. In turn, the rising edge of $Q_{100A}$ toggles flip-flop 100C back into its logic low state. The rising edge of Clock2 at time $t_7$ would normally cause flip-flop 100B to transition into its logic high state, but instead flip-flop 100B is held in reset by the high logic level of $Q_{100A}$. At time $t_8$, the rising edge of Clock1 toggles flip-flop 100A back into its logic low state.

The next rising clock edge of Clock2 occurs at time $t_9$, which causes flip-flop 100B to transition into its logic high state. In turn, the rising edge of $Q_{100B}$ causes flip-flop 100D to transition to its logic high state. The rising edge of Clock1 at time $t_{10}$ would normally cause flip-flop 100A to transition into its logic high state, but instead flip-flop 100A is held in reset by the high logic level of $Q_{100B}$. At time $t_{11}$, the rising edge of Clock2 toggles flip-flop 100B back into its logic low state.

The next rising clock edge of Clock1 occurs at time $t_{12}$, which causes flip-flop 100A to transition into its logic high state. The rising edge of $Q_{100A}$ would normally cause flip-flop 100C to transition into its logic high state, but instead flip-flop 100C is held in reset by the high logic level of $Q_{100D}$. The rising edge of Clock2 at time $t_{13}$ would normally cause flip-flop 100B to transition into its logic high state, but instead flip-flop 100B is held in reset by the high logic level of $Q_{100A}$.

At time $t_{14}$, the rising edge of Clock1 toggles flip-flop 100A back into its logic low state. The next rising clock edge of Clock2 occurs at time $t_{15}$, which causes flip-flop 100B to transition into its logic high state. In turn, the rising edge of $Q_{100B}$ toggles flip-flop 100D back into its logic low state. The rising edge of Clock1 at time $t_{16}$ would normally cause flip-flop 100A to transition into its logic high state, but instead flip-flop 100A is held in reset by the high logic level of $Q_{100B}$. At time $t_{17}$, the rising edge of Clock2 toggles flip-flop 100B back into its logic low state.

This process then repeats itself beginning at $t_{18}$. The cross connection between flip-flops yields pairs of self-synchronized alternating division patterns on the outputs generated by each pair of flip flops, as shown by the waveforms of FIG. 8. The output signals from the second pair of flip-flops are combined into signal $Y_{104}$. As shown in FIG. 8, one period of $Y_{104}$ occurs for every 4.5 periods of Clock1. Accordingly, the frequency of $Y_{104}$ is equal to the frequency of Clock1 divided by {9/2}.

Typically, dual-modulus prescalers are implemented using either a pulse swallowing or phase switching approach. Instead of using either of these approaches, some embodiments of a co-prime prescaler may implement the alternate modulus through the application of additional reset signals to the first stage flip-flops. As in the co-prime dividers previously described, the additional reset signal(s) may act to hold a resettable flip-flop in its logic low state (as opposed to merely resetting the flip-flop).

Figure 9:
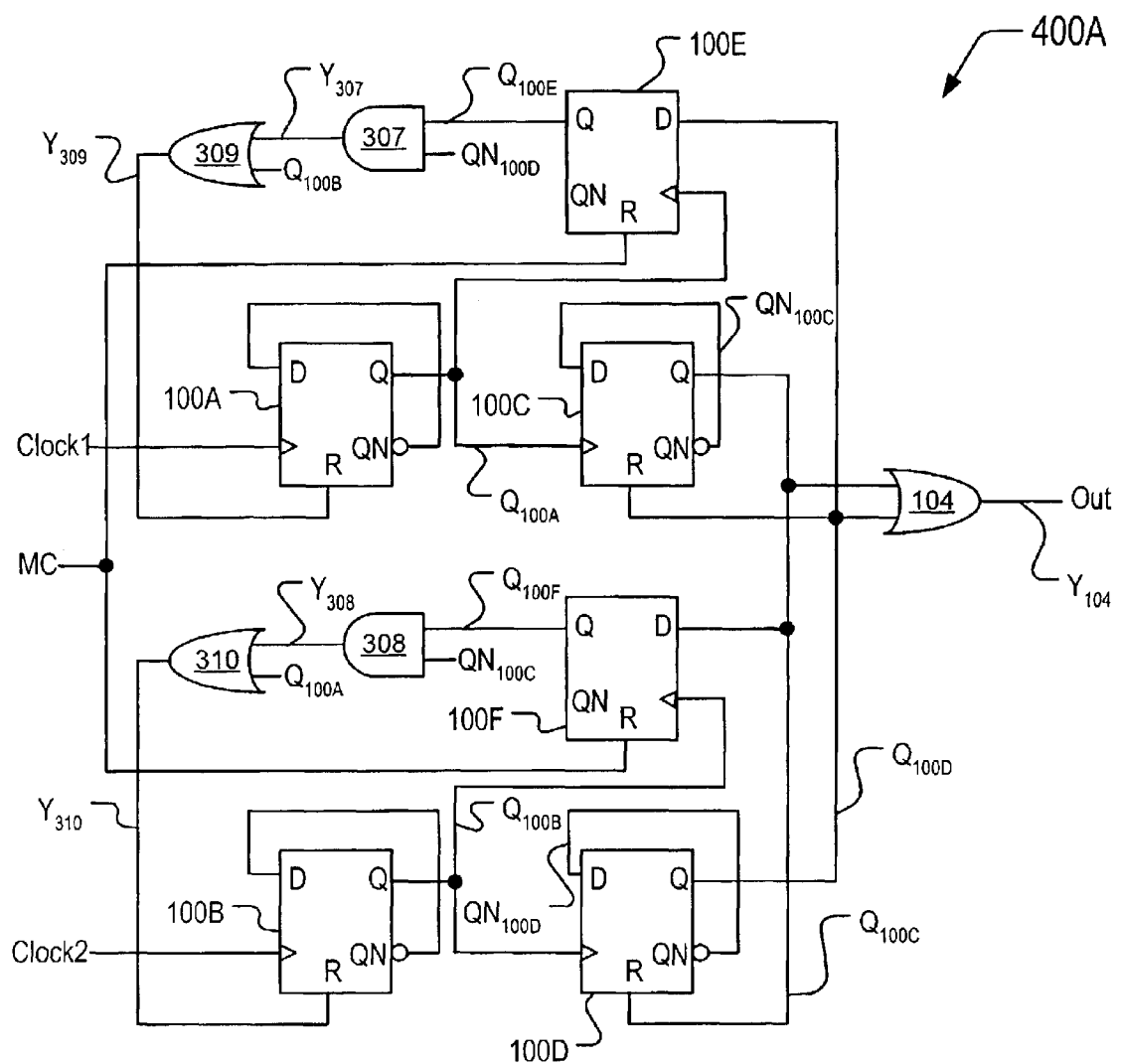
FIG. 9 shows a block diagram of an embodiment of a dual-modulus co-prime frequency divider.

FIG. 9 is a block diagram of a {9/2}/{9/2+1/2} co-prime division dual-modulus prescaler 400A. In comparing FIG. 9 to FIG. 7 (the {9/2} single-modulus co-prime divider 400), it should be noted that a dual-modulus prescaler may be implemented by adding components 100E, 100F, and 307 through 310 and a modulus control signal (MC) (e.g., as generated by the A counter 24 in FIG. 6). When MC is held at its logic high value, the system shown in FIG. 9 is the logical equivalent of the system shown in FIG. 7 because both resettable D-type flip-flops 100E and 100F will be held in their logic low state. In turn, outputs $Q_{100E}$, $Q_{100F}$, $Y_{307}$, and $Y_{308}$ will also be at the logic low value. Since logic blocks 309 and 310 perform logical OR functions and each block has one input held at the logic low value, these logic blocks simply transfer the logic value from their other input to their output. Thus, the signals $Y_{309}$ and $Y_{310}$ applied to the reset input of flip-flops 100A and 100B are $Q_{100B}$ and $Q_{100A}$, respectively. This is logically identical to the cross connections between first stage flip-flops shown in FIG. 7. Accordingly, when MC is at its logic high value, the modulus of the prescaler 400A shown in FIG. 9 will be $\{9/2\}$.

When MC is at its logic low value, the prescaler 400A divides by its alternate modulus. Both flip-flops 100E and 100F are released from being held in their logic low state and instead allow additional reset signals to be applied to the first stage flip-flops 100A and 100B. These additional reset signals interrupt the alternating division pattern of signals $Q_{100A}$ and $Q_{100B}$ once per cycle of the output signal $Y_{104}$. This interruption causes the next normally occurring state of flip-flops 100 to be skipped and then the alternating division pattern is resumed. The alternating division pattern is generated when each first stage flip-flop effectively waits for another first-stage flip-flop to transition to its logic high state and then back to its logic low state before the next first stage flip-flop transitions to its logic high state. For example, flip-flop 100B transitions to flip-flop 100B's logic high state in response to the next rising edge of Clock 2 after flip-flop 100A has transitioned back to flip-flop 100A's logic low state. Similarly, flip-flop 100A transitions back to flip-flop 100A's logic high state in response to the next rising edge of Clock1 after flip-flop 100B has transitioned back to flip-flop 100B's logic low state. Thus, the first stage flip-flops transition in the order 100A, 100B, 100A, 100B, and so on in order to generate the alternating division pattern. When this alternating division pattern is interrupted in response to the low logic level of MC, the flip-flops skip the next occurring transition in the alternating pattern. In this example, interrupting the alternating division pattern causes flip-flop 100A to transition two times in a row (once before the interrupt and once after the interrupt). Thus, in this example, the interruption of the alternating division pattern each output period causes the following transition pattern: 100A, 100B, 100A, 100A, 100B, 100A, and so on. Note that other logical values of the modulus control signal may be used to control whether the alternating division pattern is interrupted once per output cycle in other embodiments (e.g., the logic high value of the modulus control signal may cause the alternating division pattern to be interrupted once per output cycle).

Figure 10:
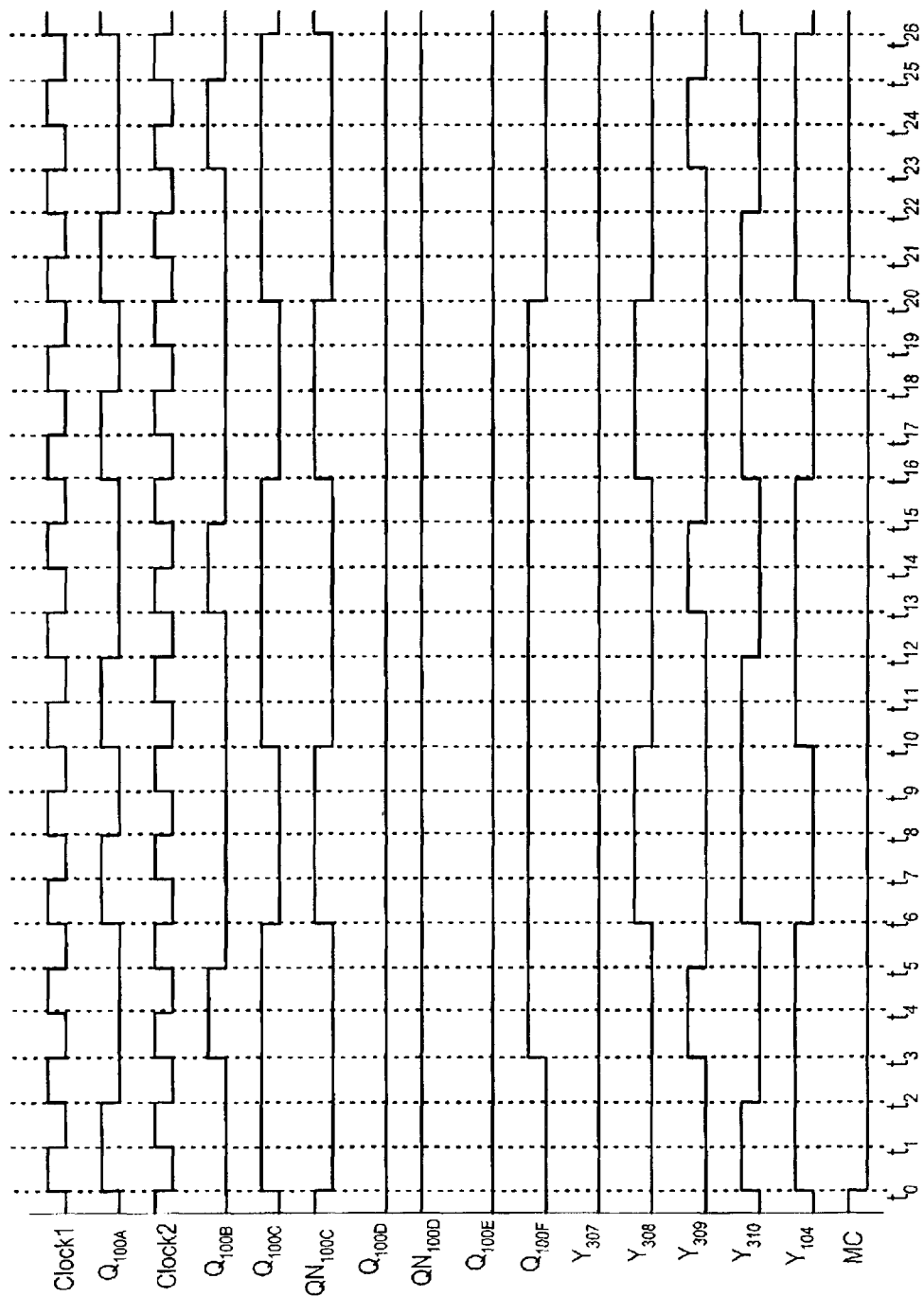
FIG. 10 shows exemplary waveforms that may be generated by an embodiment of a dual-modulus co-prime frequency divider.

The result of interrupting the alternating division pattern generated by the first stage flip-flops 100A and 100B in response to MC being at its logic low value, as can be seen in FIG. 10, is that one period of $Y_{104}$ occurs for every 5 periods of Clock1 while MC is at its logic low value. Since the primary modulus of the prescaler is $\{9/2\}$ or 4.5 and the alternate modulus is $\{9/2\}+\{1/2\}=\{10/2\}$ or 5, a fractional resolution of $\{1/2\}$ or 0.5 has been achieved.

In the idealized waveforms of FIG. 10, it is assumed that the flip-flops 100 are in their logic low states prior to time $t_0$. At time $t_0$, the rising edge of Clock1 causes the output of flip-flop 100A to transition into its logic high state. In turn, the rising edge of $Q_{100A}$ causes the output of flip-flop 100C to transition into its logic high state and causes flip-flop 100E to assume the logic value of $Q_{100D}$, which is logic low. The logic high value of $Q_{100A}$ is also transferred through OR logic block 310.

The rising edge of Clock2 at time $t_1$ would normally cause flip-flop 100B to transition into its logic high state, but instead flip-flop 100B is held in reset by the high logic level of $Y_{310}$. At time $t_2$, the rising edge of Clock1 toggles flip-flop 100A back into its logic low state. The logic low value of $Q_{100A}$ is also transferred through OR logic block 310 since its other input $Y_{308}$ is at the logic low value.

The next rising clock edge of Clock2 occurs at time $t_3$, which causes flip-flop 100B to transition into its logic high state (since flip-flop 100B is no longer being held in reset by $Y_{310}$). In turn, the rising edge of $Q_{100B}$ causes flip-flop 100F to assume the logic value of $Q_{100C}$, in this case logic high. The logic high value of $Q_{100B}$ is also transferred through OR logic block 309. The rising edge of $Q_{100B}$ would normally cause flip-flop 100D to transition into its logic high state, but instead flip-flop 100D is held in reset by the high logic level of $Q_{100C}$. The rising edge of Clock1 at time $t_4$ would normally cause flip-flop 100A to transition into its logic high state, but instead flip-flop 100A is held in reset by the high logic level of $Y_{309}$.

At time $t_5$, the rising edge of Clock2 toggles flip-flop 100B back into its logic low state. The logic low value of $Q_{100B}$ is also transferred through OR logic block 309 since OR logic block 309's other input $Y_{307}$ is at the logic low value. The next rising clock edge of Clock1 occurs at time $t_6$, which causes flip-flop 100A to transition into its logic high state. In turn, the rising edge of $Q_{100A}$ toggles flip-flop 100C back into its logic low state and causes flip-flop 100E to assume the logic value of $Q_{100D}$, which is logic low. After time $t_6$, the logic high value of $QN_{100C}$ is propagated through AND logic block 308 since its other input $Q_{100F}$ is at the logic high value. The logic high value output from AND logic block 308 is then further propagated through OR logic block 310. The rising edge of Clock2 at time $t_7$ would normally cause flip-flop 100B to transition into its logic high state, but instead flip-flop 100B is held in reset by the high logic level of $Q_{100A}$.

At time $t_8$, the rising edge of Clock1 toggles flip-flop 100A back into its logic low state. The logic low value of $Q_{100A}$ is not transferred through OR logic block 310 since its other input $Y_{308}$ is at the logic high value. The next rising clock edge of Clock2 occurs at time $t_9$, which would normally cause flip-flop 100B to transition into its logic high state, but instead flip-flop 100B is held in reset by the high logic level of $Y_{310}$.

By holding flip-flop 100B at logic low for the additional time that reset signal $Y_{310}$ is at logic high, the alternating division pattern on signals $Q_{100A}$ and $Q_{100B}$ may be interrupted, which may in turn cause division by the alternate modulus. The interruption of the alternating division pattern on signals $Q_{100A}$ and $Q_{100B}$ completes when the rising edge of Clock1 at time $t_{10}$ causes flip-flop 100A to transition into its logic high state. In turn, the rising edge of $Q_{100A}$ causes flip-flop 100C to transition into its logic high state and causes flip-flop 100E to assume the logic value of $Q_{100D}$, which is logic low. After time $t_{10}$, the logic low value of $QN_{100C}$ is propagated through AND logic block 308. $Y_{310}$ remains at logic high since its $Q_{100A}$ input is at logic high. The rising edge of $Q_{100C}$ at time $t_{10}$ is propagated through OR logic block 104 and completes one cycle of output signal $Y_{104}$. As can be seen in FIG. 10, while MC is at its logic low value from time $t_0$ to $t_{10}$, one period of output signal $Y_{104}$ occurs for the 5 periods of Clock1 and the alternate modulus of 5 is realized. Since the primary modulus of the prescaler is $\{9/2\}$ or 4.5 and the alternate modulus is $\{9/2\}+\{1/2\}=\{10/2\}$ or 5, it can be seen that a fractional resolution of $\{1/2\}$ or 0.5 has been achieved.

An integer resolution between moduli can be achieved if a co-prime division dual-modulus circuit is used as a prescaler core and is followed by an integer count extension circuit. For example, if the {9/2}/{9/2+1/2} co-prime division dual-modulus circuit of FIG. 9 is followed by a divide-by-3 count extension circuit and the MC input is held at logic low for two out of the three input cycles into the count extension circuit in order to realize the alternate modulus during those 2 cycles, an integer resolution between moduli of one (1) may be achieved for the overall prescaler. In this configuration, the primary modulus would be {9/2}*3={27/2} or 13.5 and the alternate modulus would be {9/2}+{10/2}*2= {29/2} or 14.5. Thus, an integer resolution of one (1) between moduli has been achieved.

Figure 11:
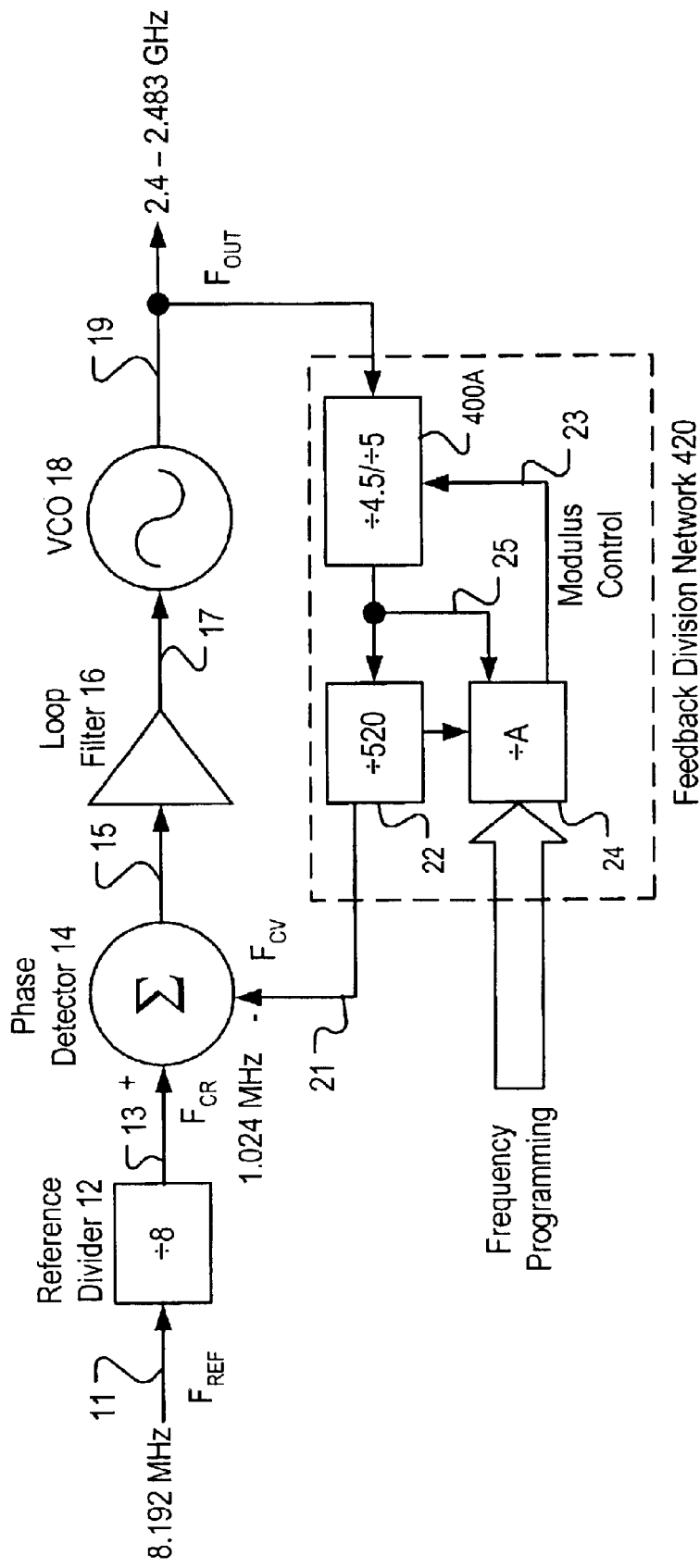
FIG. 11 illustrates another embodiment of a co-prime division PLL.

Example values that may be used to implement one embodiment of a co-prime division PLL are illustrated in FIG. 11. FIG. 11 illustrates a co-prime division PLL for use in a typical radio frequency (RF) application. In this example, the co-prime division PLL generates an output signal in the 2.4 GHz to 2.483 GHz range with frequency resolution of 512 kHz. An 8.192 MHz crystal is used as the reference signal 11, $F_{REF}$. As shown in FIG. 11, $F_{REF}$ is passed through a divide-by-8 reference divider 12 that outputs a signal Fcr 13 having a frequency of 1.024 MHz. Phase detector 14 detects a phase difference between feedback signal $F_{CV}$ 21 and $F_{CR}$ 13 and outputs an error correction signal 15 to loop filter 16, which filters the signal and outputs the filtered signal 17 to VCO 18. Note that some embodiments may use another type of oscillator instead of a VCO. The VCO 18 generates $F_{OUT}$ 19, which is then input to the feedback division network 420.

Feedback division network 420 includes a dual modulus co-prime frequency divider 400A, an M counter 22, where M=520 in this embodiment, and an A counter 24. The A counter 24 generates a modulus control (MC) signal 23 that controls which modulus, 4.5 or 5, is currently used by the co-prime frequency divider 400A.

The exemplary co-prime division PLL of FIG. 11 is described by the following equations:

$$F_{CR}=F_{REF} \div R=8.192 \text{ MHz} \div 8=1.024 \text{ MHz} \quad (13)$$

$$F_{CV}=F_{OUT} \div N_{COD}=F_{CR} \quad (14)$$

$$N_{COD}=M*Q+A*V=520*4.5+A*0.5=2340+A*0.5 \quad (15)$$

$$F_{OUT}=N_{COD}*F_{CR}=(2340+A*0.5)*1.024 \text{ MHz} \quad (16)$$

To synthesize 2.440192 GHz, the A counter 24 may be programmed to a value of 86, yielding a feedback division value of (2340+86*0.5) or 2383. Incrementing A by one (1) to a value of 87 yields a feedback division value of 2340+ 87*0.5 or 2383.5. This will synthesize 2.440704 GHz, which is 512 kHz greater in frequency. This example shows how a co-prime division PLL may, in some embodiments, achieve instantaneous fractional feedback division values with fractional valued resolution. Embodiments that support both instantaneous fractional feedback division values and fractional valued resolution may allow the phase detection frequency, $F_{CR}$, to be increased without a loss of frequency resolution because of the increased resolution in controlling the feedback division value, N. The increase in $F_{CR}$ may allow faster settling times due to the allowable increase in closed loop bandwidths. The increase in $F_{CR}$ may also allow lower phase noise levels inside the closed loop bandwidth due to the reduction in the magnitude of N. Additionally, some embodiments of a co-prime division PLL may lack systematic spurious signal content. As a result, some embodiments of a co-prime division PLL may not include special additional circuitry to mitigate the systematic spurious signal problems. Note that not all embodiments may provide these features.

Figure 12:
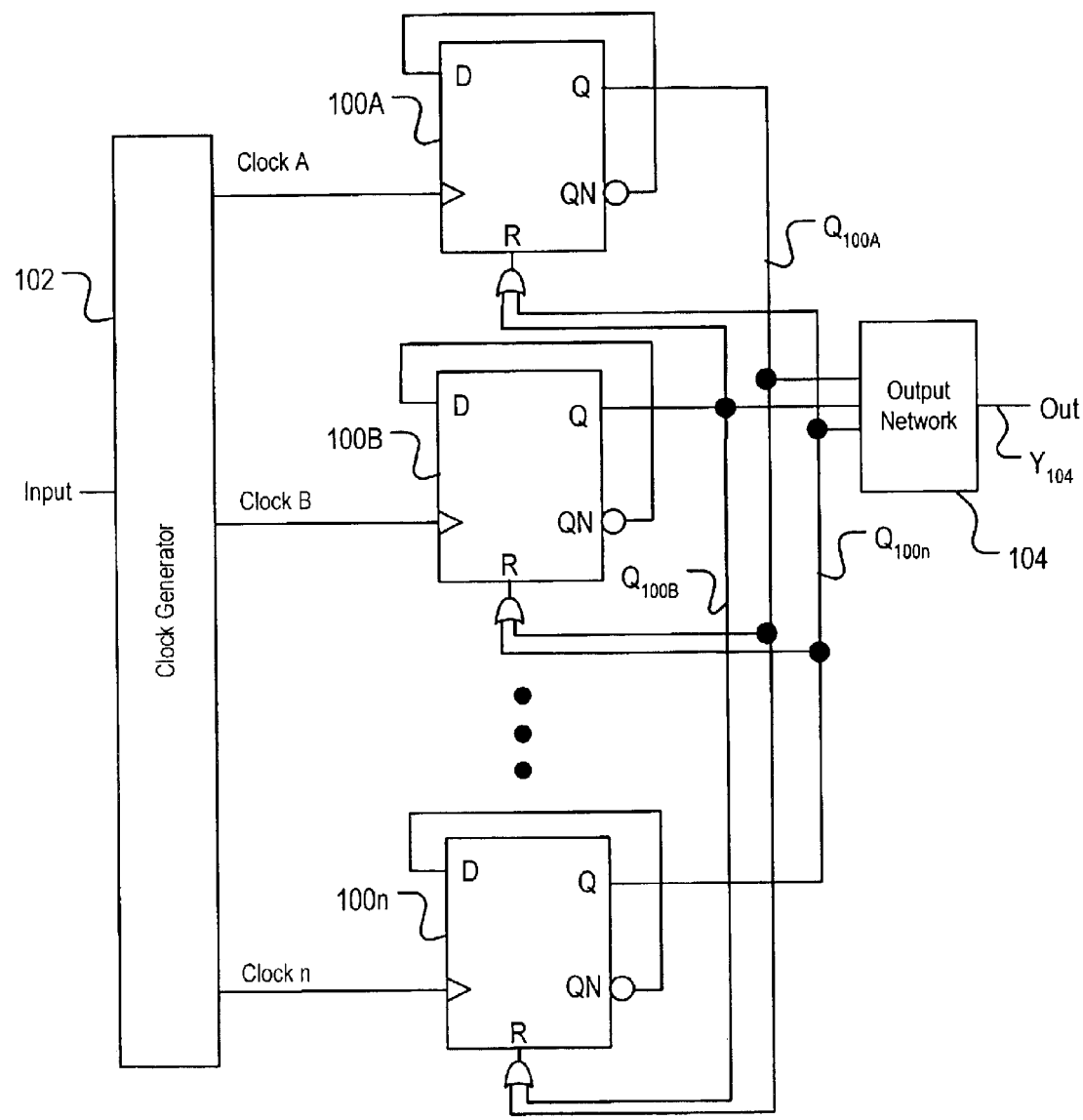
FIG. 12 shows yet another embodiment of a co-prime frequency divider.

FIG. 12 shows another embodiment of a co-prime frequency divider 400 that may be used to perform co-prime frequency division. In this embodiment, there are n flip-flops 100 (flip-flop 100A–flip-flop 100n). A clock generator 102 generates n evenly spaced phases of the input signal and provides each of the evenly spaced phases Clock A–Clock n as a clock signal to a respective one of the n flip-flips 100. The reset input of each flip-flop 100 is cross-coupled to the outputs of the other flip-flops via an OR logic function. As a result, each flip-flop is held in reset if the output of any other flip-flop is in the logic high state. The flip-flops 100 may generate an alternating division pattern of their outputs. For example, assuming an embodiment that includes six flip-flops 1–6, the flip-flops 1–6 may transition in the order 1, 2, 3, 4, 5, 6, 1, 2, 3, 4, 5, 6 in order to generate an alternating division pattern.

The outputs of the flip-flops 100 are input to an output network 104. The output network 104 may, in some embodiments, perform an OR logic function. For example, if the outputs Q100A–Q100n are input to an OR gate included in the output network 104, the resulting signal may include n output cycles for each (n+1) input cycles. The output network 104 may also include an additional stage of flip-flops, such as flip-flops 100C and 100D in FIG. 7, depending on the co-prime divider value desired. The output network 104 may also include additional reset-control flip-flops, such as flip-flops 100E and 100F shown in FIG. 9 (e.g., to implement a dual-modulus frequency divider). In such an embodiment, the additional reset-control flip-flops may control the first stage flip-flops shown in FIG. 12 such that they interrupt the alternating division pattern (e.g., in the six flip-flop example above, the interrupted alternating division pattern may be 1, 2, 3, 4, 5, 6, 2, 3, 4, 5, 6, 1, 3, 4, 5, 6, 1, 2, etc.) once per cycle of the frequency divider 400's output signal.

Figure 13:
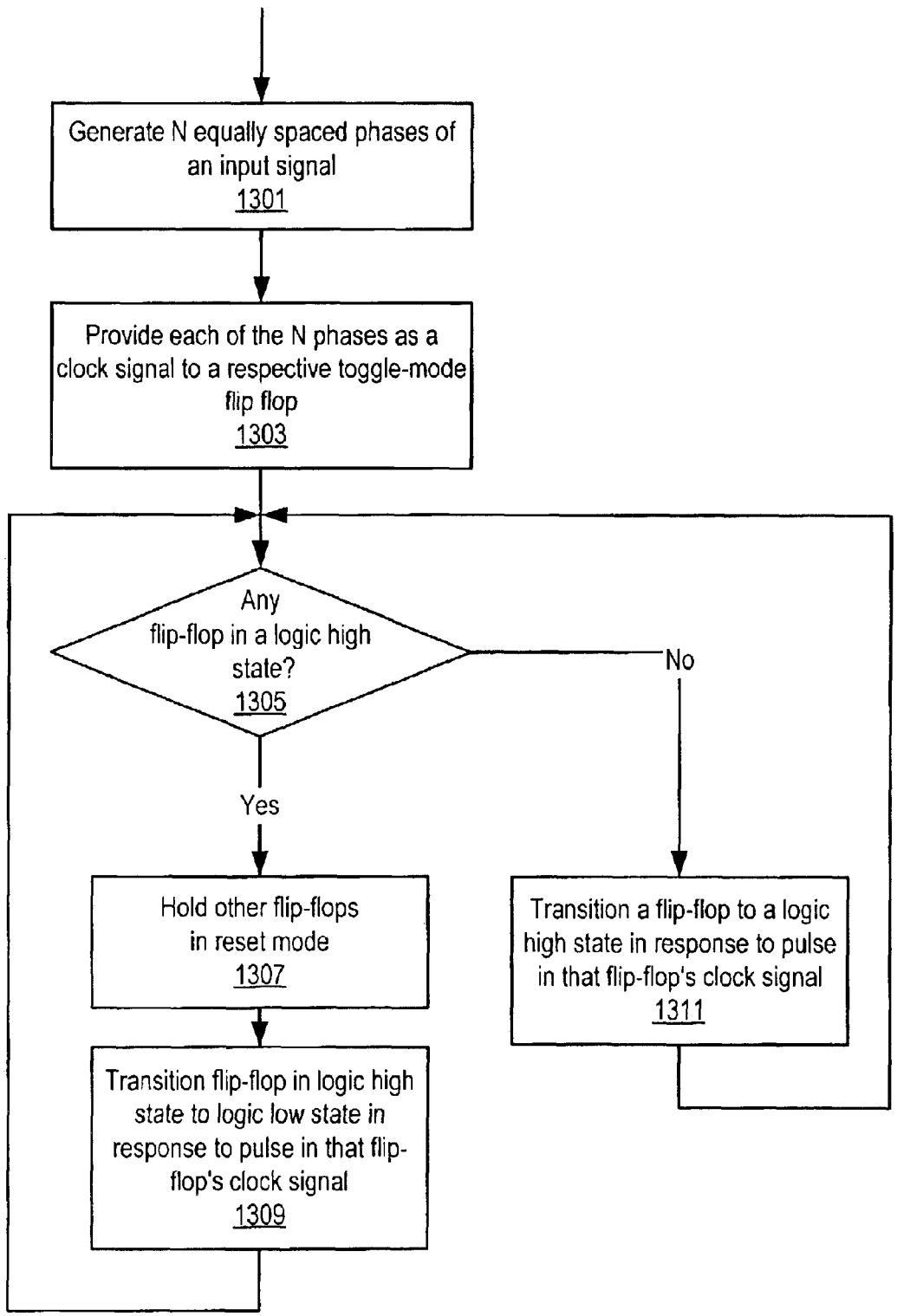
FIG. 13 shows one embodiment of a method of performing co-prime frequency division.

FIG. 13 is a flowchart illustrating one embodiment of a method of performing co-prime frequency division. At 1301, N equally spaced phases on an input signal are generated. For example, if N=3, each phase of the input signal may be spaced 120 degrees (360/3) from the other phases (e.g., there may be three phases having 0, 120, and 240 degrees offset respectively from the input signal). Each of the equally spaced phases is provided as a clock signal to a respective toggle-mode flip-flop, as shown at 1303. The flip-flops are each configured to toggle the value of their outputs in response to being clocked by a respective clock signal (e.g., by changing the logical state of an output signal in response to detecting a rising or falling edge in the clock signal).

If none of the other flip-flops (of the flip-flops receiving one of the equally spaced phases as a clock signal at 1303) are in a logic high state, a flip-flop may toggle its output to a logic high state in response to a pulse (high or low) in that flip-flop's clock signal, as shown at 1305 and 1311. If any flip-flop is in a logic high state, the remaining flip-flops (of the flip-flops clocked at 1303) are held in a reset (logic low state) mode, as shown at 1305 and 1307. The flip-flop in the logic high state may be transitioned back to its logic low state in response to the next pulse in its clock signal, as shown at 1309. The transition at 1309 may release the other flip-flops from reset mode.

The outputs of the group of flip-flops clocked at 1303 may, in one embodiment, be combined by a logical OR function (not shown in FIG. 13) to generate the output of a {(N+1)/N} co-prime frequency divider. In another embodiment, the outputs of each flip-flop clocked at 1303 may be provided as a clock input to a second stage flip-flop (not shown in FIG. 13). The second stage flip-flops may also be configured in toggle mode. The second stage may be configured such that if any second stage flip-flop is in a logic high state, the other second stage flip-flops will be held in reset mode. Similarly configured additional stages of flip-flops may be included in some embodiments.

Figure 14:
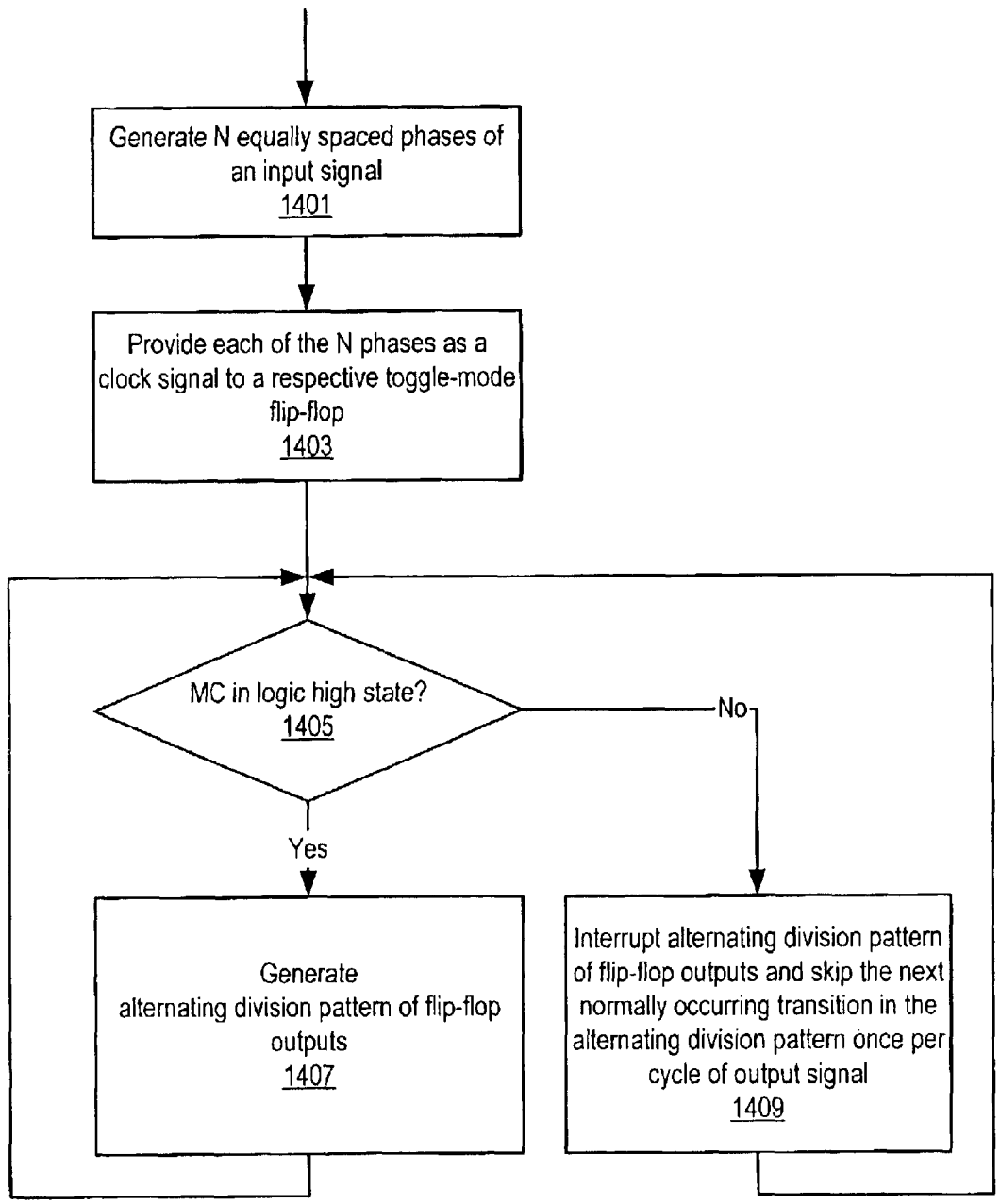
FIG. 14 shows an embodiment of a method of performing dual-modulus frequency division in which one of the moduli is an irreducible fraction.

FIG. 14 shows a flowchart of an embodiment of a method of performing dual-modulus co-prime frequency division. In this embodiment, N equally spaced phases on an input signal are generated at 1401. Each of the equally spaced phases is provided as a clock signal to a respective toggle-mode flip-flop, as shown at 1403. The flip-flops are each configured to toggle the value of their outputs in response to being clocked by a respective clock signal.

In this embodiment, if a modulus control signal (e.g., generated by an A counter 24 like the one shown in FIG. 11) is currently in a logic high state, the flip-flops operate according to an alternating division pattern (e.g., the flip-flops repeatedly transition according to a certain order). If the modulus control signal is in a logic low state, the flip-flops operate such that the alternating division pattern may be interrupted once per cycle of the output signal of the dual modulus co-prime frequency divider. Note that other embodiments may use different logical values of the modulus control signal to control whether the alternating division pattern is interrupted once per output cycle.

Note that while the above examples have used D flip-flops to implement co-prime frequency dividers, other embodiments may implement co-prime frequency dividers using other clocked storage units (e.g., registers, latches, flip-flops, memory cells, etc.) capable of being operated in a toggle mode. For example, a co-prime frequency divider may be implemented using single-bit registers or latches that are each configured to load an inverted version of the value currently stored by those registers or latches in response to being clocked. Such clocked storage units may be held in reset mode by not updating register or latch values in response to being clocked while in reset mode. Alternatively, the clocked storage units may be effectively held in reset mode by selecting a non-inverted version of the stored value as the next input in response to being clocked while in reset mode. Also note that various combinations of different types of clocked storage units may be used to implement a co-prime frequency divider in some embodiments. A clocked storage unit may have an inverted clock input (e.g., the clocked storage unit may load a new value in response to a falling edge of a clock signal) in some embodiments.

Additionally, note that the terms "logic high state" and "logic low state" may refer to when a device is outputting particular logical levels of a signal, not to when that device is outputting particular physical levels of a signal. For example, in a system using active-high logic, an electrical signal may be at a low logic level if it has a voltage level around 0 Volts. The same voltage level may represent a high logic level in a system using active-low logic.

The descriptions and examples of the embodiments of the present invention disclosed herein are intended for illustrative purposes only, and are not intended to be exhaustive or to limit the invention to the precise forms disclosed. Numerous variations and modifications will become apparent to those skilled in the art once the above disclosure is fully appreciated. It is intended that the following claims be interpreted to embrace all such variations and modifications.

What is claimed is:

1. A system comprising:
    a control unit configured to generate a modulus control signal;
    a dual modulus prescaler coupled to the control unit, wherein the dual modulus prescaler is configured to divide a frequency of an input signal by Q when the modulus control signal has a first value and to divide the frequency of the input signal by (Q+V) when the modulus control signal has a second value, wherein Q is an irreducible fraction;
    wherein the dual modulus prescaler includes a plurality of clocked storage units, wherein each clocked storage unit is clocked by a respective one of a plurality of equally spaced phases of the input signal, and wherein each clocked storage unit in the plurality of clocked storage units is configured in a toggle mode.

2. The system of claim 1, wherein the plurality of clocked storage units are included in a co-prime frequency divider; wherein when the modulus control signal has the first value, the co-prime frequency divider is configured to generate T cycles of an output signal for every S cycles of the input signal; wherein S and T are co-prime; and wherein Q equals S/T.

3. The system of claim 2, wherein S>T.

4. The system of claim 2, wherein (Q+V) is an integer.

5. The system of claim 2, wherein (Q+V) is a fraction.

6. The system of claim 1, wherein the control unit includes an A counter, wherein the A counter is configured to generate the modulus control signal.

7. A prescaler comprising:
    a clock generator configured to generate a plurality of equally spaced phases of an input signal; and
    a first plurality of clocked storage units coupled to the clock generator, wherein each clocked storage unit included in the first plurality of clocked storage units is clocked by a respective one of the plurality of equally spaced phases of the input signal;
    wherein each clocked storage unit in the first plurality of clocked storage units is configured in a toggle mode;
    wherein each clocked storage unit included in the first plurality of clocked storage units is configured to operate in a reset mode when any other clocked storage unit included in the first plurality of clocked storage units has a logical high output.

8. The prescaler of claim 7, wherein at least one of the clocked storage units includes a flip-flop.

9. The prescaler of claim 7, wherein each least one of the clocked storage units includes a single-bit register.

10. The prescaler of claim 7, further comprising an output unit configured to receive an output from each clocked storage unit in the first plurality of clocked storage units, wherein the output unit is configured to output a logical high output when any of the first plurality of clocked storage units has a logical high output and to output a logical low output when none of the first plurality of clocked storage units has a logical high output.

11. The prescaler of claim 7, further comprising a second plurality of clocked storage units, wherein a clock input of each clocked storage unit of the second plurality of clocked storage units is coupled to receive an output signal from a respective one of the first plurality of clocked storage units, wherein each of the second plurality of clocked storage units is configured in a toggle mode.

12. The prescaler of claim 11, wherein each of the second plurality of clocked storage units is configured to be held in a reset mode when any other one of the second plurality of clocked storage units has a logical high output.

13. The prescaler of claim 11, further comprising an output unit configured to receive an output from each clocked storage unit in the second plurality of clocked storage units, wherein the output unit is configured to output a logical high output if any of the second plurality of clocked storage units has a logical high output and to output a logical low output if none of the second plurality of clocked storage units has a logical high output.

14. The prescaler of claim 7, further comprising reset control logic configured to generate a plurality of reset signals and to provide a respective one of the plurality of reset signals to each of the first plurality of clocked storage units;

wherein if a modulus control signal has a first value, the reset control logic is configured to generate the plurality of reset signals such that outputs of the first plurality of clocked storage units follow an alternating division pattern; and wherein if the modulus control signal has a second value, the reset control logic is configured to generate the plurality of reset signals such that the outputs of the first plurality of clocked storage units interrupt the alternating division pattern once per cycle of an output signal generated by the prescaler;

wherein the alternating division pattern is generated when the outputs of the first plurality of clocked storage units transition in repeating order.

15. The prescaler of claim 14, wherein the prescaler has a modulus of Q when the modulus control signal has the first value, wherein Q is an irreducible fraction, and wherein the prescaler has a modulus of (Q+V) when the modulus control signal has the second value, wherein (Q+V) is an integer.

16. The prescaler of claim 14, wherein the prescaler has a modulus of Q when the modulus control signal has the first value, wherein Q is an irreducible fraction, and wherein the prescaler has a modulus of (Q+V) when the modulus control signal has the second value, wherein (Q+V) is a fraction.

17. A method comprising:

generating N equally spaced phases of an input signal;

clocking each of a plurality of clocked storage units with a respective one of the N equally spaced phases of the input signal;

operating each of the plurality of clocked storage units in a toggle mode;

if any one of the plurality of clocked storage units is in a logic high state, holding each other one of the clocked storage units in a reset mode.

18. The method of claim 17, wherein at least one of the clocked storage units includes a flip-flop.

19. The method of claim 17, wherein each least one of the clocked storage units includes a single-bit register.

20. The method of claim 17, further comprising generating an output signal, wherein the output signal has a high logic level if any one of the plurality of clocked storage units is in the logic high state, wherein the output signal has a low logic level if none of the plurality of the clocked storage units is in the logic high state.

21. The method of claim 17, further comprising:

clocking each of a second plurality of clocked storage units with an output signal generated by a respective one of the plurality of clocked storage units; and operating each of the second plurality of clocked storage units in a toggle mode.

22. The method of claim 21, further comprising:

if any one of the second plurality of clocked storage units is in a logic high state, holding each other one of the second plurality of clocked storage units in a reset mode.

23. The method of claim 21, further comprising generating an output signal, wherein the output signal has a high logic level if any one of the second plurality of clocked storage units is in the logic high state, wherein the output signal has a low logic level if none of the second plurality of the clocked storage units is in the logic high state.

24. The method of claim 17, further comprising:

wherein if a modulus control signal has a first value, the plurality of clocked storage units is configured to each generate outputs according to an alternating division pattern; and wherein if the modulus control signal has a second value, the plurality of clocked storage units is configured to interrupt the alternating division pattern once per cycle of an output signal;

wherein the alternating division pattern occurs when outputs generated by the plurality of clocked storage units transition in repeating order.

25. The method of claim 24, wherein the output signal has an output frequency equal to an input frequency of the input signal divided by Q when the modulus control signal has the first value, wherein Q is an irreducible fraction; and wherein the output frequency equals the input frequency divided by (Q+V) when the modulus control signal has the second value, wherein (Q+V) is an integer.

26. The method of claim 24, wherein the output signal has an output frequency equal to an input frequency of the input signal divided by Q when the modulus control signal has the first value, wherein Q is an irreducible fraction; and wherein the output frequency equals the input frequency divided by (Q+V) when the modulus control signal has the second value, wherein (Q+V) is a fraction.

* * * * *